United States Patent [19]

Maury et al.

[11] Patent Number: 4,569,722

[45] Date of Patent: Feb. 11, 1986

[54] ETHYLENE GLYCOL ETCH FOR PROCESSES USING METAL SILICIDES

[75] Inventors: Alvaro Maury, Langhorne, Pa.; Louis C. Parrillo, Warren, N.J.

[73] Assignee: AT&T Bell Laboratories, Murray Hill, N.J.

[21] Appl. No.: 674,421

[22] Filed: Nov. 23, 1984

[51] Int. Cl.$^4$ .................. B44C 1/22; C03C 15/00; C03C 25/06; C23F 1/00

[52] U.S. Cl. .................. 156/657; 134/3; 156/653; 156/655; 252/79.3; 252/79.4

[58] Field of Search .............. 156/653, 655, 657, 662; 252/79.3, 79.4; 134/3

[56] References Cited

U.S. PATENT DOCUMENTS

| | | | |
|---|---|---|---|
| 3,571,913 | 3/1971 | Bodway et al. | 29/571 |
| 3,642,549 | 2/1972 | Couture | 252/79.4 X |
| 4,276,557 | 6/1981 | Levinstein et al. | 357/67 |
| 4,364,793 | 12/1982 | Graves | 156/643 |

OTHER PUBLICATIONS

"Refractory Metal Silicides of Titanium . . .", *IEEE Trans. on Elec. Devices*, vol. ED-27, No. 8, 8/80, S. Murarka et al., pp. 1409–1417.

"Refractory Metal Silicides for VLSI . . .", *J. Vac. Sci. Tech.*, vol. 19, No. 3, 9–10/81, A. Sinha, pp. 778–785.

"Composite TiSi$_2$/n+ Poly-Si . . .", *IEEE Trans. on Elec. Devices*, vol. ED-29, No. 4, 4/82, K. Wang et al., pp. 547–553.

"Formation and Properties of TiSi$_2$ . . .", *Thin Solid Films*, vol. 100, 1983, A. Guldan et al., pp. 1–7.

"Refractory Metal Silicides:Thin-Film . . .", *IEEE Trans. on Elec. Devices*, vol. ED-30, No. 11, 11/83, T. Chow et al., pp. 1480–1497.

"Reactive Ion Etching for Submicron . . .", *J. Vac. Sci. Tech. B*, vol. 1, No. 4, 10–12/83, M. Zhang et al., pp. 1037–1042..

"Ion Beam Etching of Silicon . . .", *J. Electrochem. Soc.*, vol. 131, No. 2, J. Chinn et al., pp. 375–380.

*Primary Examiner*—William A. Powell
*Attorney, Agent, or Firm*—Wendy W. Koba

[57] ABSTRACT

A novel etchant which comprises a mixture of ethylene glycol and hydrofluoric acid, preferably buffered hydrofluoric acid, has been found to control the etch rate of refractory metal silicides, in particular titanium silicide, in a manner such that titanium silicide may be used in place of tantalum silicide for interconnects and gates in semiconductor integrated circuits.

7 Claims, No Drawings

ETHYLENE GLYCOL ETCH FOR PROCESSES USING METAL SILICIDES

BACKGROUND OF THE INVENTION

1. Field of the Invention

The present invention relates to an etchant for use in association with metal silicides and, more particularly, to an etchant which comprises a mixture of ethylene glycol and hydrofluoric (HF) acid and is capable of controlling the etch rate of metal silicides, and in particular titanium silicide, such that titanium silicide may be used in place of tantalum silicide in the formation of integrated circuits without requiring any modifications of the conventional etching process associated with the use of tantalum silicide.

2. Description of the Prior Art

In the past, polycrystalline silicon, referred to as polysilicon, was utilized in the manufacture of integrated semiconductor devices to form the gates for active devices and the interconnections between the devices. However, the RC time constant associated with long runs of polysilicon interconnect was often the dominant delay-producing element. Therefore, as the demand for greater packing density and complexity increased, the signal propagation delay associated with the sheet resistance of polysilicon (which is on the order of 30 to 60 ohm/square) led to the search for an alternative material which could be used in place of or in conjunction with polysilicon. Refractory metal silicides such as $TiSi_2$, $WSi_2$, $MoSi_2$, and $TaSi_2$ are considered viable alternatives to polysilicon. U.S. Pat. No. 4,276,557 issued to H. J. Levinstein et al on June 30, 1981, discloses an integrated structure and method of manufacture which utilizes either $TiSi_2$ or $TaSi_2$ as a substitute for polysilicon. However, Levinstein et al does not discuss any of the problems associated with the volatility of $TiSi_2$ in the presence of the conventional etch solution consisting of buffered hydrofluoric (HF) acid. The reactivity of titanium silicide with buffered HF is discussed in the article "Refractory Silicides of Titanium and Tantalum for Low-Resistivity Gates and Interconnects", by S. P. Murarka et al appearing in *IEEE Transactions on Electron Devices,* Vol. ED-27, No. 8, August 1980, at pp. 1409–1417. In discussing the etching of tantalum and titanium silicide, Murarka et al states that the approximate overall etch rate of $TaSi_2$ and $TiSi_2$ films in a 10:1 BHF (buffered hydrofluoric acid) solution are 300 Å/minute and over 1500 Å/minute, respectively. In association with this excessive etch rate of titanium silicide, any conventional amount of this material which would be used for gates and interconnects would thus be completely removed after being immersed in 10:1 BHF for about one minute. Therefore, any process which uses titanium silicide as a metallization layer needs to be monitored closely since any slight operator miscalculation will result in the complete removal of the titanium silicide material. In light of this problem, Murarka et al recommends that the use of titanium silicide should be limited to processes where the metallization would not be exposed to any HF-containing solutions.

However, it is well known that titanium silicide has a lower resistivity than tantalum silicide (approximately 15–25 $\mu$-cm versus 60–75 $\mu$-cm). Therefore, it is desirable to fine some method of using titanium silicide in place of tantalum silicide which does not require extreme processing controls during the integrated circuit manufacturing process.

SUMMARY OF THE INVENTION

The problem remaining in the prior art has been solved in accordance with the present invention, which relates to an etchant for use in association with metal silicides and, more particularly, to an etchant which comprises an ethylene glycol:HF mixture which is capable of controlling the etch rate of titanium silicide such that titanium silicide can be used in place of tantalum silicide.

It is an aspect of the present invention to provide a method of removing silicon dioxide contaminant from titanium silicide films which does not require any additional processing of the titanium silicide. In accordance with the present invention, the conventional buffered HF etchant used in the prior art silicon dioxide cleaning process is merely replaced with the novel ethylene glycol:HF mixture without requiring any other change in the manufacturing process.

Another aspect of the present invention is the utilization of the ethylene glycol:HF etchant in association with the other refractory metal silicides, for example, tantalum silicide, so that only one etchant is used regardless of the type of metal silicide employed.

Other and further aspects of the present invention will become apparent during the course of the following discussion.

DETAILED DESCRIPTION

The present etching technique is particularly applicable to the utilization of titanium silicide as interconnect and gate material for the manufacture of large scale integrated circuits. However, it is to be understood that the etchant described below is equally applicable to an arrangement which uses tantalum silicide or any other refractory metal silicide.

When a refractory metal silicide is used as the interconnect routing between devices on a semiconductor wafer substrate, and as the gate material for the active devices, subsequent processing will cause a layer of silicon dioxide to form on top of the metal silicide and the exposed silicon regions which will be simultaneously contacted with the metal. Prior to the final metallization step in the formation process, the silicon dioxide covering the metal silicide gate structures and exposed silicon regions on the window areas must be removed so that a good contact can be made between the gates, sources/drains, and the metal leads. This operation is often referred to as "window cleaning" and is a standard processing step in the manufacture of integrated circuits. When tantalum silicide is the refractory metal silicide used for gates and interconnects, the standard 30:1 buffered HF ($H_2O$:BHF) etchant can be used to remove the silicon dioxide contaminant, where the entire wafer can be immersed in a buffered HF bath to remove the silicon dioxide. However, when this same process is used on wafers containing titanium silicide gates and interconnects, the buffered HF removes not only the silicon dioxide, but also etches the titanium silicide film structure forming the gates and interconnects at an undesirably rapid rate. It has been determined through experimentation that the etch rate of titanium silicide in 30:1 buffered HF is approximately 600 Å/minute, as compared to the 50–100 Å/minute etch rate of tantalum silicide. In order to use the conventional buffered HF etch, therefore, the process of removing any silicon dioxide from the exposed silicon regions without severely attacking the titanium silicide requires extremely tight control. Little room is left for operator error since a small amount of excess exposure of the titanium silicide to a conventional buffered HF etchant will cause the entire titanium silicide structure in the exposed window areas to be destroyed.

The etchant of the present invention provides a simple solution to this problem. The novel etchant comprises a mixture of ethylene glycol and hydrofluoric acid and has been found to reduce the etch rate of titanium silicide from approximately 600 Å/minute to <70 Å/minute. In a preferred method of practicing the present invention, buffered hydrofluoric acid, for example 30:1 BHF or 15:1 BHF, has been found to provide better control over the etching process. In the present etch technique, the ratio of ethylene glycol to buffered HF may be, for example, anywhere from 6:4 to 8:2 and provide the controllable etching required with the utilization of titanium silicide gates and interconnects, although other combinations of ethylene glycol and hydrofluoric acid may also be used. The ratio of 7:3 (seven parts of ethylene glycol to three parts 30:1 buffered HF), however, is considered to be the optimum combination of ethylene glycol and buffered HF in terms of retarding the etch rate of titanium silicide while still providing a sufficient etch rate (100–150 Å/minute) for the silicon dioxide. As stated above, it is to be understood that other strengths of buffered HF, for example 30:1 buffered HF, or even undiluted hydrofluoric acid, may also be combined with a sufficient amount of ethylene glycol to form the etchant solution of the present invention.

As stated above, the ethylene glycol:buffered HF etchant of the present invention may simply replace the conventional buffered HF etchant in the processing of the semiconductor wafer. That is, to remove any amount of silicon dioxide contamination, the wafer is simply immersed in a bath of ethylene glycol:buffered HF to remove the silicon dioxide layer. It has been found that the etch rate of $SiO_2$ in the exemplary 7:3 ethylene glycol:buffered HF etchant is between 100–150 Å/minute. Therefore, if a silicon dioxide layer comprises a thickness of approximately 700 Å, the wafer may be immersed in a bath of 7:3 ethylene glycol:buffered HF for 8–10 minutes to remove the entire layer of silicon dioxide. It has been found that a film of titanium silicide which is exposed to the 7:3 mixture of ethylene glycol:buffered HF for this same period of time will remain essentially intact. Therefore, the etchant of the present invention allows for the replacement of tantalum silicide with titanium silicide in any integrated circuit which used this material for interconnects and gates. As stated above, tantalum silicide is also impervious to this etchant, allowing ethylene glycol, buffered HF etchant solution of the present invention to replace the conventional buffered HF regardless of the refractory metal used.

What is claimed is:

1. A method for removing oxide materials from refractory metal silicides using an etching solution consisting essentially of ethylene glycol and hydrofluoric acid.

2. The method of claim 1 wherein buffered hydrofluoric acid is used in the etching solution.

3. The method of claim 2 wherein the hydrofluoric acid is buffered to a 30:1 concentration ($H_2O:HF$).

4. The method of claim 2 wherein the hydrofluoric acid is buffered to a 15:1 concentration ($H_2O:HF$).

5. The method of claim 2 wherein the etching solution comprises 60% to 80% ethylene glycol and 40% to 20% buffered hydrofluoric acid.

6. The method of claim 5 wherein the etching solution comprises 70% ethylene glycol and 30% buffered hydrofluoric acid.

7. The method of claim 1 wherein the refractory metal silicide is titanium silicide.

* * * * *